United States Patent [19]

Gloton et al.

[11] Patent Number: 4,908,937
[45] Date of Patent: Mar. 20, 1990

[54] METHOD TO INSTALL AN ELECTRONIC COMPONENT AND ITS ELECTRICAL CONNECTIONS ON A SUPPORT, AND PRODUCT OBTAINED THEREBY

[75] Inventors: Jean-Pierre Gloton, Aix en Provence; Gérard Coiton, Venelles, both of France

[73] Assignee: SGS-Thomson Microelectronics, S.A., Gentilly, France

[21] Appl. No.: 283,214

[22] Filed: Dec. 12, 1988

[30] Foreign Application Priority Data
Dec. 14, 1987 [FR] France .................. 87 17386

[51] Int. Cl.[4] .................................... H05K 3/34
[52] U.S. Cl. ........................... 29/840; 156/244.12;
156/293; 156/295; 437/180
[58] Field of Search .................. 29/840, 841;
156/244.12, 293, 295; 264/272.17; 437/180

[56] References Cited

U.S. PATENT DOCUMENTS

| 4,567,643 | 2/1986 | Droguet et al. | 437/180 |
| 4,746,392 | 5/1988 | Hoppe | 29/827 X |
| 4,801,765 | 1/1989 | Moyer et al. | 29/827 X |

FOREIGN PATENT DOCUMENTS 0128822 12/1984 European Pat. Off. .
60-095941 5/1985 Japan .
61-015289 1/1986 Japan .

Primary Examiner—Carl J. Arbes
Attorney, Agent, or Firm—Roland Plottel

[57] ABSTRACT

Disclosed is a method for installing an electronic component and its electrical connections on a support provided with a cavity to house said component. A metallic layer is cut out into zones on which there is deposited a layer of polyimide which mechanically holds the said zones during the operations for the electrical connection of the electronic component and for encapsulation and installation on the support. This method avoids the use of a supporting film and of a bonder to fix the metallic joints to the film, namely elements that do not withstand high temperatures during encapsulation.

7 Claims, 2 Drawing Sheets

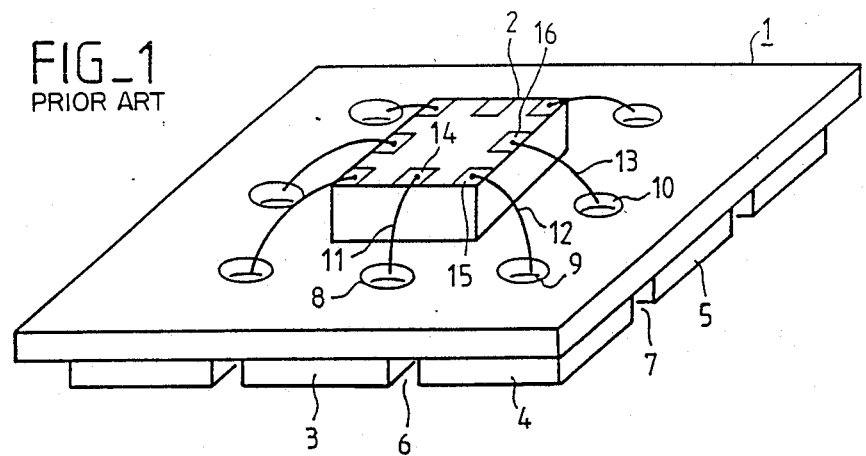
FIG_1 PRIOR ART
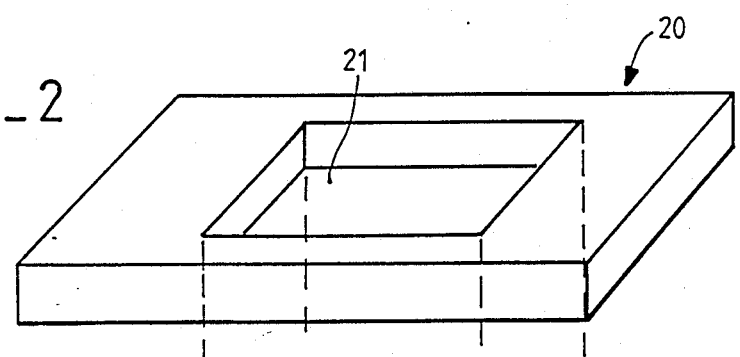
FIG_2
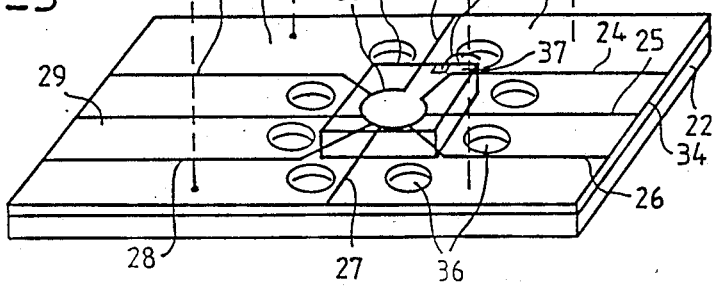
FIG_3

FIG_4
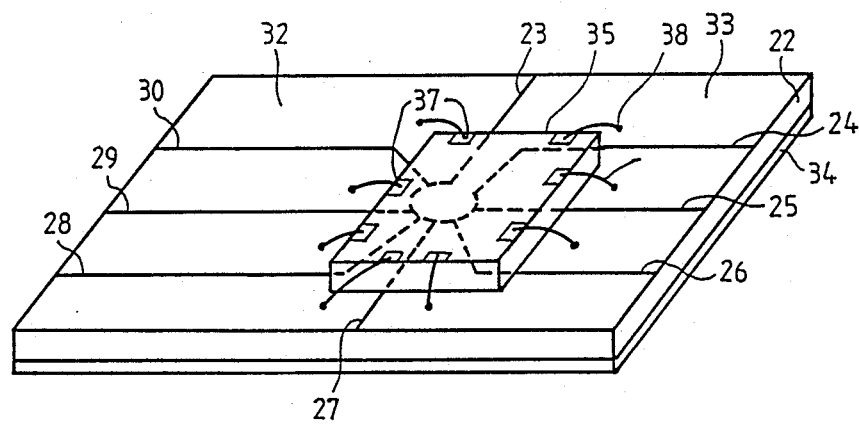

METHOD TO INSTALL AN ELECTRONIC COMPONENT AND ITS ELECTRICAL CONNECTIONS ON A SUPPORT, AND PRODUCT OBTAINED THEREBY

BACKGROUND OF THE INVENTION

1. Field of the Invention

The invention concerns a method to install an electrical component and its contacts on a support, such as an identification or bank card; it also concerns the product obtained by the implementation of this method.

2. Description of the Prior Art

Identification or identity cards are used in many fields, especially in the field of bank cards or credit cards. However, for a long time, apart from an identification number and the bearer's number, these cards have had only a magnetic recording enabling identification by magnetic reading. For many years now, these cards have been used for other functions than for identifying the bearer and, especially, for prepayment and protection against fraudulent activities. To this end, the card has an active electronic component which may consist of an electronic memory which may or may not be associated with a microprocessor, thus enabling its use especially for banking type applications.

Prior art cards, which have an electronic component are manufactured in various ways. According to a first method, a cavity is made in the thickness of the card to accommodate the electronic component. According to another method, known as "co-lamination", thin layers of plastic material as an epoxy material, polyethylene, polyvinylchloride etc. are laminated around the component. During the implementation of these methods, various other operations are further performed to connect the terminals of the electronic component electrically with metallizations placed on the surface of the card.

One method used to install the electronic component in the cavity made in the card and to place metallizations on the card as well as to make the connections between the terminals of the card and the metallizations consists, as shown in FIG. 1, in the use of a non-conductive film 1, made of an epoxy material, for example. This film has, on one side, the electronic component in the form of a chip (reference 2) and, on the other side, metallized surfaces such as those marked 3, 4 and 5 separated from one another by spaces 6 and 7 without metallization. These metallized surfaces 3, 4 and 5 communicate with the other side of the film 1 by means of holes 8, 9 and 10 through which the ends of the conducting wires 11, 12 and 13 are connected with the corresponding metallized surfaces by any known means such as a conductive bonder. The other end of each conducting wire is connected to an output terminal 14, 15 or 16 of the chip 2.

These operations are then followed by the coating of the chip 2 with resin and curing of the resin, by heat, to encapsulate the chip. The chip can then be installed in the cavity of the card and metallizations can be placed at the edge of the cavity by simply fitting in the chip and bonding the support film 1 to the card after it has been cut out to the requisite dimensions.

The method which has just been briefly described above has the following drawback: the film 1 and the bonder used to hold the metallizations 3, 4 and 5 cannot withstand temperatures of more than 150° C. The result thereof is a considerable increase in the time needed to cure the resin used to encapsulate the chip 2. This is costly, especially in an automatic manufacturing line.

An object of the present invention, therefore, is to overcome the above-mentioned drawbacks by the application of a method for installing an electronic component and its electrical connections on a support enabling higher curing temperature for the coating resin, thus giving a shorter curing time and, therefore, lower costs.

SUMMARY OF THE INVENTION

The invention relates to a method for installing an electronic component and its electrical connections in a support having a cavity to house said component, said method comprising the following operations:
  (a) the depositing of a metallic layer on a working support such as a wafer;
  (b) the cutting up of this metallic layer into zones that are electrically insulated from one another,
  (c) the depositing of a polyimide layer on one side of these metallic zones,
  (d) the laying, on one side of these metallic zones, of the electronic component having output terminals,
  (e) the electrical connection of the output terminals of the electronic component to the metallic zones,
  (f) the coating of the electrical component by a resin,
  (g) the heating of the entire unit at a high temperature so as to quickly obtain the hardening of the resin,
  (h) the positioning of the set on the support, so that the encapsulated electronic component is housed in the cavity.

The invention also relates to a product, obtained by implementing said method, which comprises a supporting card provided with a cavity and an electronic component placed in said cavity, wherein said electronic component is placed directly on a metallic layer which is bonded to the card and wherein this metallic layer is divided into zones, each corresponding to a contact.

In an alternative embodiment of the method, the product obtained has an electronic component which is fixed to the metallic layer by means of a polyimide layer.

BRIEF DESCRIPTION OF THE DRAWINGS

Other features and advantages of the present invention will appear from the following description of a particular embodiment, made with reference to the appended drawings, of which:

FIG. 1 is a perspective view of a supporting film for an electronic component and its electrical connections, implementing a method according to the invention, FIG. 2 is a perspective view of a memory card designed to receive an electronic component, FIG. 3 is a perspective view of an electronic component placed on a metallic layer of the support, implementing the method according to the invention, FIG. 4 is a perspective view of another embodiment of the invention.

DESCRIPTION OF PREFERRED EMBODIMENTS

FIG. 1 corresponds to the prior art and has been described in the preamble. FIG. 2 shows a memory card 20 which has, in its middle, a cavity 21 in which an electronic component, for example the chip 2 of FIG. 1, has to be housed. In the prior art method, to install the chip in its housing, it is of course necessary to present the film 1 upside down with respect to the card 20, so that the chip 2 gets fitted into the cavity 21.

According to the invention, the supporting film 1 is replaced by a layer 22 of a metal such as, for example, copper or nickel. This layer will be a few tens of microns thick, for example eighty microns thick. This metallic layer 22, deposited on a working support (not shown) is cut out long the line shown by the segments 23 to 30 connected to the center by a circular cut 31. This circular cut can be made by any known means and, notably, by a chemical attacking process such as etching or a mechanical process in using a laser device.

These various segments 23 to 31 delineate metallic zones such as those marked 32 and 33, which are electrically separated so as to act as contacts. To ensure that these different zones do not get separated from one another, a layer 34 of polyimide or silicone is deposited on their entire surface. This deposit is made in liquid phase on the metal and naturally adheres to the latter without modifying the structure of the metal and of the metallic zones. Instead of polyimide or silicone, it is possible to use epoxy resin deposited at very high temperature. This polyimide layer is about a few microns thick; for example it is three microns thick. In FIG. 3, this polyimide layer is assumed to be transparent.

In the next operation, an electronic component 35 is laid down and bonded to the metallic layer 22. For this purpose, two methods are possible: one method is to turn over the unit of FIG. 3 so that the polyimide layer 34 is in contact with the working support (FIG. 4). The other method is to remove the polyimide layer at the position where the component 35 has to be bonded by any known method, for example by chemical etching with masking. In this second method, the mask is designed to remove the polyimide layer, not only at the position of the component 35 but also at the places 36 where the electrical connections between the component and the metallic zones have to be made. When the zone of the component has been cleared in the polyimide layer, the component 35 is bonded to said zone by means of a bonder which withstands high temperatures.

This operation for bonding the component 35 is followed by an operation for the electrical connection of each of the output terminals 37 of the chip 35 to a metallic zone 32 by means of a conductive wire 38. The ends of each conducting wire can be connected by any known means, for example by bonding, using a conductive bonder.

At this stage in the method, the set comprising the polyimide layer 34 and the metallic layer 22, carrying the electrical component 35 and the electrical connections 38 is ready for the encapsulation of the electrical component 35 ad the electrical connections by any known method, particularly molding in resin followed by the heating of the set to harden the resin and obtain a compact block (not shown). Owing the absence of a supporting film for the metallic layer and of a holding bonder between this metallic layer and the supporting film, namely elements that do not withstand temperatures of over 150° C., the set shown in each of the FIGS. 3 and 4 can be heated to temperatures up to 300° C., thus considerably accelerating the process by which the encapsulating resin is hardened. The result of this is a simpler type of automatic manufacturing line and saving of time and money.

When the encapsulating operation is over, the component/metallic layer set is installed on the card 20 (FIG. 2) so that the compact block containing the component 35 and its electrical connections fit into the cavity 21 and so that the metallic zones lie on the edges of the cavity where they are fixed by any known methods, notably by boding. It will be noted that these metallic zones lie directly on the edges of the cavity 21 in the case of FIG. 4, but do so through the polyimide layer 34 in the case of FIG. 3.

In the case of FIG. 4, since the polyimide layer 34 meets the outer side of the metallic zones after being installed on the card, this layer must be removed to clear the metallic zones so that they fulfil their role of electrical contacts. This removing process can be performed by any known method, for example by chemical etching without masks or, again, by a mechanical method such as polishing.

In the example of FIG. 2, there is also provision to remove the polyimide burrs which may be formed n the side of the metallic zones opposite that of the polyimide layer. This cleaning operation can be performed before or after the component/metallic layer set is installed on the card. In this cleaning operation, it should be seen to it that the underlying polyimide layer 44 is not damaged.

During this operation to remove the polyimide layer or its burrs on the opposite side, the polyimide in the spaces between the metallic zones is also removed, so that said zones appear in relief on the center of the support 20 and in such a way that there may be communication holes between the cavity 21 and the environment outside the card. To prevent these holes, it is provided that the encapsulation process will give a capsule with dimensions as close as possible to those of the cavity. It may also be provided to let the polyimide remain between the metallic zones: this means that no chemical etching process should be used to remove the polyimide but that, rather, mechanical polishing should be used.

In the case of the method corresponding to FIG. 3, the polyimide layer 34 remains in position in the final device. According to an alternative method, the polyimide layer may be removed after the set is installed in the card but, in this case, it must be noted that the mechanical strength of the metallic zones is lower. To overcome this problem, it is proposed to leave the polyimide joints in their position between said zones and to replace the polyimide layer by a layer of bonder which is used to fix the set to the card.

What is claimed is:

1. A method for installing an electronic component and its, electrical connections in a support having a cavity to house said component, said method comprising the following operations:
    (a) depositing of a metallic layer;
    (b) cutting up of this metallic layer into zones that are electrically insulated from one another,
    (c) depositing of a polyimide layer on one side of these metallic zones,
    (d) laying, on one side of these metallic zones, the electronic component having output terminals,
    (e) electrically connecting the output terminals of the electronic component to the metallic zones,
    (f) coating of the electrical component by a resin,
    (g) heating of the entire unit at a high temperature so as to quickly obtain the hardening of the resin,
    (h) positioning of the unit on the support, so that the encapsulated electronic component is housed in the cavity.

2. A method according to claim 1 wherein the electronic component is laid on that side of the metallic layer which is opposite the polyimide layer and wherein it comprises the following additional operation:

the removal of the polyimide layer so as to clear the metallic zones without damaging the polyimide joints between the metallic zones.

3. A method according to claim 2, wherein the operation for the removal of the polyimide is designed also to remove the polyimide joints between the metallic zones.

4. A method according to claim 1, wherein the electronic component is laid on the side of the polyimide layer and wherein the operation for the electrical connection of the output terminals of the electronic component is preceded by an operation to remove the layer of polyimide at least at the positions of the metallic zones designed to set up the electrical connections.

5. A method according to claim 4, wherein the operation to remove the polyimide layer also concerns the position where the electronic component has to be laid.

6. A method according to claim 4 or 5, wherein the operation to install the unit on the support is preceded by an operation to remove the polyimide layer without damaging the polyimide joints between the metallic zones.

7. A method for installing an electronic component and its electrical connections in a support having a cavity to house said component, said method comprising the following operations:
   (a) depositing of a metallic layer;
   (b) cutting up of this metallic layer into zones that are electrically insulated from one another,
   (c) depositing of a silicone and/or epoxy resin layer on one side of these metallic zones,
   (d) laying, on one side of these metallic zones, the electronic component having output terminals,
   (e) the electrically connecting the output terminals of the electric component to the metallic zones,
   (f) coating of the electrical component by a resin,
   (g) heating of the entire unit at a high temperature so as to quickly obtain the hardening of the resin,
   (h) positioning of the unit on the support, so that the encapsulated electronic component is housed in the cavity.

* * * * *